United States Patent [19]

Banerjee

[11] Patent Number: 4,969,019
[45] Date of Patent: Nov. 6, 1990

[54] THREE-TERMINAL TUNNEL DEVICE

[75] Inventor: Sanjay K. Banerjee, Richardson, Tex.

[73] Assignee: Texas Instruments Incorporated, Dallas, Tex.

[21] Appl. No.: 90,320

[22] Filed: Aug. 27, 1987

[51] Int. Cl.$^5$ ............... H01L 29/10; H01L 29/90; H01L 29/88

[52] U.S. Cl. .................. 357/22; 357/23.4; 357/13; 357/12

[58] Field of Search ............... 357/23.4, 13, 12, 22

[56] References Cited

U.S. PATENT DOCUMENTS

| | | | |
|---|---|---|---|
| 3,045,129 | 7/1962 | Atalla et al. | 357/12 |
| 3,309,586 | 3/1967 | Kleinknecht | 357/12 |
| 3,922,710 | 11/1975 | Koike | 357/12 |
| 4,622,573 | 11/1986 | Bakeman et al. | 357/12 |

FOREIGN PATENT DOCUMENTS

| | | | |
|---|---|---|---|
| 59-154076 | 9/1984 | Japan | 357/12 |
| 60-79776 | 5/1985 | Japan | 357/12 |
| 60-245168 | 12/1985 | Japan | 357/12 |

OTHER PUBLICATIONS

S. Hofstein et al., "The Insulated Gate Tunner JCN, Triode," IEEE Trans on Elec. Dev., vol. ED-12, #2, Feb. 1965, pp. 66–76.
W. Fischer, "Field Induced Tunnel Diode," IBM Tech. Discl. Bull., vol. 16 #7, Dec. 1973, 22303.
"Physics of Semiconductor Devices", S. M. Sze, Bell Laboratories, Inc. Murray Hill, N.J.; John Wiley & Sons.
"A New Three-Terminal Tunnel Device", IEEE Electron Device Letters, vol. EDL-8, No. 8, Aug. 1987 by Sanjay Banerjee et al.
"A Band-to-Band Tunneling Effect in The Trench Transistor Cell: Part I"; by Banerjee et al.; Symposium on VLSI Technology, 1987, Japan.

Primary Examiner—Rolf Hille
Assistant Examiner—Wael Fahmy
Attorney, Agent, or Firm—James C. Kesterson; James T. Comfort; Melvin Sharp

[57] ABSTRACT

A semiconductor device for generating tunnel electron carries without a depleted PN junction. A heavily doped P-type semiconductor region (12) is formed in a lightly doped P-type semiconductor substrate (10), and spaced apart from a heavily doped N-type semiconductor region (18), forming a conduction channel (20) therebetween. A thin electrical insulator (14) is formed overlying the P-type region (12) and the conduction channel (20). A gate conductor (16) is formed overlying the thin insulating layer (14). Connections to the semiconductor device are provided by a substrate terminal (22) connected to the substrate (10), a gate terminal (24) connected to the gate conductor (16), and a drain terminal (26) connected to N-type semiconductor region (18). A voltage applied to the gate terminal (24) is effective to cause band bending in the P-type region (12) in excess of the band gap, thereby causing tunneling of electrons from the valence band to the conduction band. Inversion of the P-type region (12) is prevented by a drain voltage applied to the N-type region (18) which attracts conduction electrons.

28 Claims, 1 Drawing Sheet

THREE-TERMINAL TUNNEL DEVICE

TECHNICAL FIELD OF THE INVENTION

The present invention relates in general to semiconductor devices, and more particularly relates to solid state devices which exhibit a tunnel current phenomenon.

BACKGROUND OF THE INVENTION

Electrical devices fabricated with semiconductor materials are often characterized by electron current flow and hole current flow which provide the basis for transistor action. Other than the highly important transistor action which can be accomplished by using P and N junctions, other unique electrical effects can be obtained. For example, an electron tunneling effect can be achieved by forming a junction between a highly doped P-type semiconductor material and a highly doped N-type semiconductor material. When so formed, a negative resistance characteristic can be achieved, i.e., as the forward voltage across the junction is increased, the current therethrough decreases. Such negative resistance characteristics have been utilized in amplifiers and other circuits such as mixers, oscillators and detectors. The high-frequency characteristics achieved by the tunneling effect make such devices particularly applicable to microwave circuits.

The tunneling of electrons through a PN junction occurs most effectively when a high electric field exists in a semiconductor, such as within a reverse-biased depletion region of a silicon PN junction. A narrow depletion region can be achieved when the doping level of the P and N-type materials is high, on the order of 1E18 atoms per cm$^2$, or greater. With such a narrow depletion region, electrons can tunnel therethrough from the P side to the N side, where otherwise such phenomena would not occur. The tunneling (or Zener breakdown) of electrons occurs when the covalent bonds between neighboring silicon atoms become distorted, whereupon some bonds are torn apart, thereby resulting in conduction electrons and holes. The phenomenon in which the conduction electrons penetrate through the energy gap is termed "tunneling." Tunnel transistor operation is described in the text *Physics of Semiconductor Devices*, by S. M. Sze, published by John Wiley & Sons, Inc. 1981.

While the tunnel effect of currently available two-terminal diodes is highly advantageous in certain applications, such devices are required to be integrated with other devices having other characteristics to achieve an overall circuit function. In addition, the tunnel effect of conventional tunnel diodes cannot be controlled, except by circuits external thereto. Hence, it can be seen that a need exists for a semiconductor device with a terminal for controlling the characteristics of the device. An associated need exists for a semiconductor device which exhibits electrical characteristics, other than the negative resistance characteristic, to thereby enhance the flexibility and application of such device.

SUMMARY OF THE INVENTION

In accordance with the present invention, the disclosed semiconductor device, and method of fabrication thereof, substantially reduce or eliminate the disadvantages and shortcomings associated with the prior art devices and methods. According to the invention, a semiconductor capacitor structure is formed having a gate conductor and a thin insulator formed over a heavily doped P-type (P+) region. When a gate voltage is applied to the gate conductor, a depletion region forms in the P-type region, and continues until the onset of inversion. A heavily doped N-type (N+) region is formed close to the P-type region, but is separated therefrom by a lightly doped P-type substrate region which becomes inverted by the gate voltage to form a conduction channel between the P+ and N+ regions. A terminal is connected to the N-type region, as well as to the lightly doped P-type substrate. A positive voltage can be applied to the N-type region to prevent inversion in the P+ region, and thus allow such region to enter a deep depletion mode, without a Zener breakdown occurring between the heavily doped P region and the heavily doped N region. A surface energy band bending occurs in the P+ region which is greater than the bandgap energy. A tunneling effect thus occurs within the bulk material of the P-type region. The conduction electrons which are generated in the P+ region pass through the conduction channel and are collected by the N-type region. The substrate terminal may be grounded, or otherwise connected to an AC ground potential.

The electrical characteristics exhibited by the semiconductor device of the invention include a monotonic increasing conductance, with increasing gate voltages, thereby rendering the device well adapted for use in nonlinear circuits. Also, the output characteristics of the device exhibit a high impedance which presents an advantage over well-known MOS transistors. An additional technical advantage of the invention is that with given gate voltages, the current through the device is constant, irrespective of the drain current, thereby exhibiting constant current characteristics. An additional technical advantage presented by the invention is that such a device can be constructed using conventional silicon semiconductor processing techniques, and thus new or costly fabrication steps are unnecessary.

BRIEF DESCRIPTION OF THE DRAWINGS

Further features and advantages will become apparent from the following and more particular description of the preferred embodiment of the invention, as illustrated in the accompanying drawings in which like reference characters generally refer to the same parts or functions throughout the views, and in which.

DETAILED DESCRIPTION OF THE INVENTION

Figure 1:
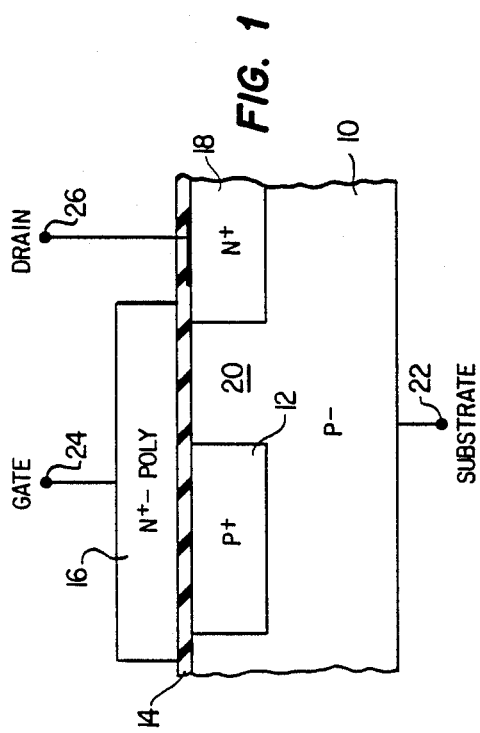
FIG. 1 is a sectional view of a silicon wafer in which the three-terminal semiconductor device of the invention is fabricated.

FIG. 1 illustrates the semiconductor device of the invention, as fabricated using MOS circuit processing technology. From the description of the invention which ensues, those skilled in the art may find that the principles and concepts of the invention may be utilized in other forms or structures. The semiconductor device of the invention is fabricated, starting with a lightly doped P− substrate 10. The doping level of the P-type impurities may be in the range of about $10^{13}$–$10^{16}$ atoms per cm². After appropriate mask and pattern steps, a heavily doped P+ region 12 is formed within the substrate 10. The P+ region is herein referred to as a source region of the device. The doping level of the P-type impurities in the P+ region 12 is preferable greater than $10^{18}$ atoms per cm². The P+ region 12 can be formed by diffusion or ion implantation techniques, using boron or other suitable P-type impurities.

A thin electrical insulating layer 14 is formed over the surface of the wafer, such as by oxidizing the silicon material to form a thin layer of silicon dioxide ($SiO_2$). A layer of silicon dioxide of a thickness of 100-300 angstroms is suitable to function as a thin dielectric material. A doped polysilicon (polycrystalline silicon) layer 16 is then deposited over the surface of the wafer, to a non-critical depth of about 1000 angstroms, or more. The polysilicon layer 16 may be deposited as an in situ doped material, or be deposited and subsequently doped to exhibit electrical conductive properties. The polysilicon layer 16 is masked and patterned to defined an opening for forming a heavily doped N+ region 18, spaced-apart from the heavily doped P+ region 12. A spacing sufficient to prevent a Zener breakdown between the P+ region 12 and the N+ region 18 is preferable. While the spacing between the P+ region 12 and the N+ region 18 is a function of the voltages applied to the device, such regions are preferably spaced about 1 micron apart for typical nonlinear circuit voltages of 5-15 volts. The N+ region 18 is referred to herein as a drain region.

Continuing with the process for fabricating the three-terminal device of the invention, the patterned wafer is next subjected to an etch process, wherein the polysilicon material 16 and silicon dioxide material 14 defined by the opening are removed, thereby exposing the underlying P− substrate 10. An N-type impurity, such as phosphorus, is implanted or otherwise diffused into the substrate 10, to form the N+ region 18, self-aligned with the edge of the polysilicon gate material 16. The formation of semiconductor regions which are self-aligned with gate conductors are well-known in the art. Importantly, the conductive polysilicon gate layer 16 somewhat overlies the N+ region 18. A conduction channel 20 of P− material is thus defined in the space between the P+ region 12 and the N+ region 18.

While not shown in detail, the three-terminal device of the invention is completed by connecting a substrate terminal 22 in electrical contact with the semiconductor substrate 10, a gate terminal 24 in electrical contact with the gate conductor 16, and a drain terminal 26 in electrical contact with the N+ region 18. Of course, when integrating such a device in a chip with other semiconductor circuits, the noted terminals may not be externally available for connection, but may be connected by diffused or deposited conductors to other circuits.

Having described the construction of the three-terminal tunnel device of the invention, the electrical operation thereof will next be described. The unique electrical characteristics of the invention can be realized by connecting the substrate terminal 22 to an AC or DC ground potential. The gate terminal 24 is connected to a positive voltage. As a result, an electrical field is generated across the thin insulating layer 14, thereby forming a depletion region in the P+ layer 12. In this respect, the gate conductor 16, thin dielectric insulator 14 and semiconductor region 12 function as a semiconductor capacitor. The extent of the depletion region in the P+ region 12 is determined by the magnitude of the positive voltage on the gate terminal 24. A depletion layer is also formed in the channel region 20 of the substrate 10. However, because the channel region 10 is more lightly doped than the P+ region 12, the extent of the depletion layer in the channel region 20 is greater than that in the heavily doped P+ region 12. With a sufficient gate voltage magnitude, the channel region 20 inverts at the surface thereof interfacing with the insulating layer 14, thus forming a conduction channel for electrons traveling from the p+ region 12 to the N+ region 18.

According to an important feature of the invention, inversion of the P+ region is prevented by connecting the drain terminal 26 of the device to a positive voltage to thereby collect electrons arising from the tunneling phenomenon in the P+ region 12. The tunnel electrons generated within the P+ region 12 are conducted through the inverted part of the conduction channel 20 to the N+ region 18, and thus to the positive supply voltage connected to the drain terminal 26. In practice, the voltage connected to the drain terminal 26 may be slightly higher than that connected to the gate terminal 24. It can be appreciated that with the provision of the N+ region 18, the P+ region 12 is prevented from becoming inverted, and thus a deep, but narrow, depletion region is formed in the heavily doped region 12.

The term deep depletion does not connote the depth by which such region is formed within the P+ region 12, but rather signifies the concentration of charge carriers. In other words, the invention is characterized by a depletion region which does not extend very far down into the P+ region (narrow), and which region has been substantially depleted of charge carriers (deep depletion). It can be appreciated by those skilled in that art that the deep depletion region is formed as a result of the electric field applied to the P+ region 12 via the dielectric 14.

With a sufficiently deep and narrow depletion region formed in the P+ region 12, an energy band bending occurs which is greater than the band gap energy characteristic of the P+ region 12. Once this occurs, electrons of the silicon atoms can tunnel within the P+ region 12 from the valence band to the conduction band. In contrast with devices heretofore known which experience the tunneling phenomenon, in the present invention the electrons tunnel in the bulk material of the P+ region 12, without tunneling through a thin depletion regions at the interface of a PN junction. The bulk tunneling occurring within the P+ region 12 is the result of the deep and narrow depletion region, with a corresponding band bending which exceeds the band gap in the very narrow depletion region.

As noted, the generated tunnel electrons are attracted to the positive voltage applied to the N+ region 18. In like manner, the holes are attracted to the P− substrate 10 which is connected to a potential which is less than that applied to the drain terminal 26. The reason the band bending can exceed the bandgap energy and not be clamped at twice the Fermi potential is that the N+ region 18, being connected to a positive potential, removes any inversion electrons generated in the P+ region 12. The semiconductor capacitor structure is thus allowed to enter into deep depletion. The theory of operation of the device of the invention is described in IEEE *Electron Device Letters*, August 1987, Vol. EDL-8, No. 8, pp. 347-349, by Banerjee et al, the subject matter of which is incorporated herein by reference. Various concepts are also described in the technical article "A Band-To-Band Tunneling Effect in the Trench Transistor Cell: Part I", by Banerjee et al., Symposium on VLSI Technology, 1987, Japan, the subject matter of which is incorporated herein by reference.

Figure 2:
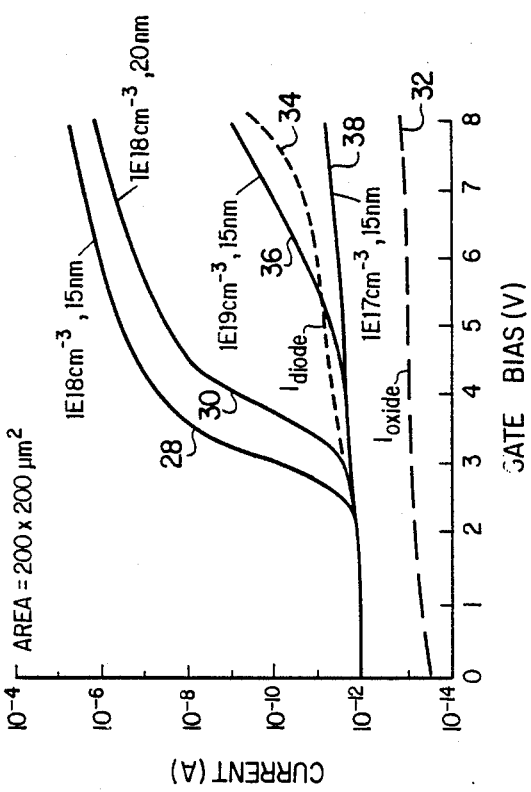
FIG. 2 is a diagram which graphically depicts the various current flow characteristics of the device.

When the gate terminal 24 and the drain terminal 26 are connected together, and both connected to a voltage which is ramped upwardly with a positive potential, the results thereof are graphically illustrated in FIG. 2, as lines 28 and 30. For a doping level of 1E18cm$^{-3}$ in the P+ region 12 and with a dielectric oxide thickness of 15 nanometer (nm), there exists an onset of tunnel current at a gate voltage, $V_g = V_d = 3$ volts. If the thickness of the insulating layer 14 is increased to 20 nm, the tunnel current decreases, as the electric field in the channel region 12 of the substrate 10 decreases, at the same $V_g$. Similarly, if the impurity doping in the P+ region 12 is excessive, e.g., 1E19cm$^{-3}$, the surface potential does not bend more than a band gap in this bias range. A slight tunnel current exists in the transition region from the P+ material 12 to the P− material 20, as shown by line 36. Also, if the impurity doping in the P+ region 12 is too low, e.g., 1E17cm$^{-3}$, the band bending which exists may be sufficient, but the depletion regions are too wide, thereby eliminating any tunnel current, as shown by line 38. The leakage current through the thin insulating layer 14, and the reverse leakage current through the junction between the N+ region 18 and the substrate 10 are also illustrated in FIG. 2 for comparison purposes. The oxide leakage current is shown as line 32, while the junction leakage current is shown as line 34. Both such currents are sufficiently lower than the tunnel currents illustrated by lines 28 and 30.

Figure 3:
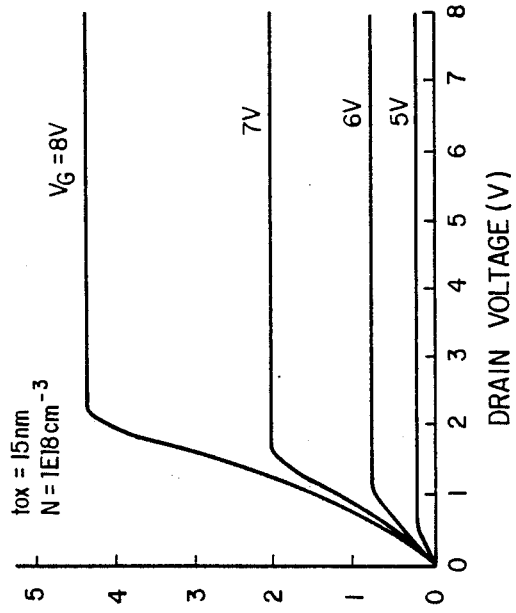
FIG. 3 is a graphical plot illustrating the output current-voltage characteristics of the device of the invention.

FIG. 3 illustrates in graphical form the electrical output characteristics of the three-terminal device of the invention, namely, drain voltage versus drain current, as a function of gate voltage. As can be noted, for different gate voltages, the drain current versus drain voltage curves resemble the output curves of a MOS transistor. The nature of these electrical characteristics is the result of the tunneling of the electrons, which depend upon the magnitude of the gate voltage, and are independent of the drain voltage. This can be appreciated as for each magnitude of gate voltage, a certain number of electrons are generated. With a specified drain voltage, all the tunnel electrons are attracted to the N+ region 18, and a further increase of the drain voltage has no further effect on drain current, as no additional free electrons are available for collection by the N+ region 18.

As further illustrated from FIG. 3, the transconductance of the three-terminal device is different than that of a MOS transistor. The transconductance, which is defined by a change in the drain current as a function of a change in the gate voltage, is seen to increase. The transconductance of the device not only increases with increasing gate voltage ($V_g$), but rather increases monotonically. Generally, the transconductance of MOS transistor devices tends to initially increase, and then decrease with increasing gate voltage. The monotonically increasing transconductance characteristic of the three-terminal device of the invention arises because the tunnel current generated within the P+ region 12 increases rapidly with increases in the gate voltage. In contrast, the transconductance of conventional MOS transistors increases to a certain value, and then saturates or decreases, according theoretical determinations. In practice, the transconductance of such known transistor devices decreases because source/drain parasitic resistance effects begin to predominate. The characteristic of the nonlinear increasing transconductance of the device of the invention makes it particularly applicable to a large number of applications in nonlinear analog circuit applications, such as mixers and oscillators.

As can also be seen from the graph of FIG. 3, with a constant gate voltage $V_g$, the drain current is unaffected by changes in the drain voltage. Hence, by maintaining a constant gate voltage applied to the device, the drain current provides a constant current source to circuits requiring the same. Since the tunnel current can be controlled by the drain voltage, such a device can be utilized as a controllable reference voltage source. As noted by the slope of the drain current generated by drain voltages of more than about two volts, the three-terminal device of the invention exhibits a very high output impedance. The slope of the output curves at such region is $V_d/I_d$, which is equivalent to the output impedance of the device. With such a flat horizontal nature, the output impedance of the three-terminal device is much higher than that exhibited by a conventional MOS transistor. The output impedance of the device of the invention essentially comprises a reverse biased diode defined by the N+ region 18 and the substrate 10.

From the foregoing, it can be seen that there is disclosed a semiconductor device having electrical characteristics not heretofore available in single two-terminal device. The technical advantage of such a device is that certain of its terminals can be connected together to allow the device to function as a Zener diode. Another technical advantage presented by the invention is that a constant current source device is provided, with the current selected by choosing a stable gate voltage. Yet another technical advantage presented by the invention is that the nonlinear increasing transconductance characteristic makes the device particularly applicable to nonlinear circuits. The high output impedance exhibited by the three-terminal device of the invention provides a technical advantage, in that when connected to other circuits, minimal loading thereof occurs. Another technical advantage, from a fabrication standpoint, is that the three-terminal device of the invention can be constructed utilizing conventional silicon processing steps and equipment.

While the preferred embodiment of the invention has been disclosed with reference to a specific three-terminal device, it is to be understood that many changes in detail may be made as a matter of engineering choices without departing from the spirit and scope of the invention, as defined by the appended claims. Indeed, those skilled in the art may prefer to utilize different impurities, or impurity types, in fabricating the various semiconductor regions, or apply different polarity voltages thereto.

What is claimed is:

1. A semiconductor device, comprising:
   a heavily doped semiconductor region of a first conductivity type;
   a gate terminal effective to cause the generation of tunnel electrons and associated holes in said first conductivity type semiconductor region when a gate voltage is applied to said gate terminal;
   a semiconductor region associated with a substrate terminal for collecting the hole carriers;
   a heavily doped semiconductor region of a second conductivity type; and a drain terminal effective to cause the tunnel electron carriers to be collected by said second conductivity type region to thereby provide a device which provides electrical functions by the generation of tunnel electrons.

2. The semiconductor device of claim 1, wherein said first and second conductivity type semiconductor regions are spaced apart sufficiently to prevent Zener breakdown therebetween.

3. The semiconductor device of claim 1, wherein said first conductivity type semiconductor region comprises a P-type material, said second conductivity type semiconductor region comprises an N-type material and said semiconductor region associated with said substrate terminal comprises a P-type material.

4. The semiconductor device of claim 3, wherein said semiconductor region associated with said substrate terminal includes an impurity doping concentration less than that of said first conductivity type semiconductor region.

5. The semiconductor device of claim 1, further including a conductive gate conductor and a thin insulator for insulating said gate conductor and said first conductivity type region.

6. The semiconductor device of claim 5, wherein said first and second conductivity type semiconductor regions are spaced apart to define a conduction channel therebetween comprising said semiconductor material associated with said substrate terminal, and said gate conductor and said thin insulator overlie said conduction channel.

7. The semiconductor device of claim 1, wherein said first type conductivity semiconductor region includes an impurity concentration in the range of 1E18–1E19.

8. A semiconductor device, comprising:
a semiconductor substrate of a first conductivity type;
a pair of spaced apart semiconductor regions formed in said substrate, a first said semiconductor region comprising a first conductivity type material having an impurity concentration greater than that of said substrate, and a second said semiconductor region being of a second conductivity type semiconductor material;
a conduction channel comprising said semiconductor substrate material located between said first and second semiconductor regions;
a thin electrical insulator formed over said first and second semiconductor regions and over said conduction channel; and
a conductive gate conductor formed over said insulator at locations overlying said first semiconductor region and said conduction channel.

9. The semiconductor device of claim 8, further including a gate terminal electrically connected to said gate conductor, a drain terminal electrically connected to said second semiconductor region, and a substrate terminal connected to said semiconductor substrate.

10. The semiconductor device of claim 8, wherein said gate conductor comprises doped polycrystalline silicon.

11. The semiconductor device of claim 8, wherein said electrical insulator comprises silicon dioxide.

12. The semiconductor device of claim 8, wherein said first semiconductor region and said semiconductor substrate material are doped with a P-type impurity.

13. The semiconductor device of claim 8, wherein said first semiconductor region includes a P-type impurity of a concentration sufficient to cause tunnel electron generation when a gate voltage is applied to said gate conductor.

14. The semiconductor device of claim 8, further including means for generating tunnel electrons and associated holes in said first semiconductor region when a voltage is applied to said gate conductor.

15. The semiconductor device of claim 14, further including means for collecting said tunnel electrons by said second semiconductor region, and for collecting said associated holes by said semiconductor substrate.

16. A semiconductor device, comprising:
a three-terminal device having a gate terminal, a drain terminal and a substrate terminal;
a heavily doped semiconductor region responsive to a voltage applied to said gate terminal for generating tunnel electron carriers without said carriers being developed across a depleted PN junction;
a semiconductor region responsive to a voltage applied to said drain terminal for collecting said tunnel electrons; and
means responsive to a potential applied to said substrate terminal for collecting hole carriers.

17. The semiconductor device of claim 16, wherein said heavily doped semiconductor region is responsive to said voltage applied to said gate terminal for forming a narrow and deep depletion region.

18. The semiconductor device of claim 17, wherein said semiconductor region responsive to a voltage applied to said drain terminal comprises a heavily doped region doped with an impurity type opposite that of said heavily doped semiconductor region.

19. The semiconductor device of claim 16, wherein said heavily doped semiconductor region and said semiconductor region are spaced apart sufficient to prevent Zener breakdown therebetween.

20. A semiconductor device, comprising:
a first semiconductor region having an impurity concentration sufficient such that when subjected to an electric field, a deep and narrow depletion region forms therein; and
a second semiconductor region spaced apart from said first semiconductor region, and biased such that electron carriers generated by an onset of inversion of said first semiconductor region are attracted to said second semiconductor region, thereby preventing inversion of said first region and such that tunnel electron carriers are generated in said first region in the bulk material thereof without being generated across a depleted semiconductor junction.

21. The semiconductor device of claim 20, further including a semiconductor conduction channel separating said first semiconductor region from said second semiconductor region, and wherein said electric field causes inversion of said semiconductor channel to thereby provide a conduction medium for the tunnel electron carriers between said first semiconductor region and second semiconductor region.

22. The semiconductor device of claim 21, wherein said first semiconductor region comprises a heavily doped P-type material, and said conduction channel comprises a lightly doped P-type material.

23. The semiconductor device of claim 20, wherein said second semiconductor region comprises a heavily doped N-type semiconductor material.

24. The semiconductor device of claim 21, further including a gate conductor and a thin gate insulator overlying said first semiconductor region and said conduction channel.

25. The semiconductor device of claim 24, further including means for applying a voltage to said gate conductor to generate said electric field, means for applying a voltage to said second semiconductor region for attracting said tunnel electron carriers, and means for applying a potential to said conduction channel for attracting hole carriers.

26. The semiconductor device of claim 24, wherein said device is characterized by a transconductance which increases nonlinearly with increasing gate voltages.

27. The semiconductor device of claim 20, wherein said device is characterized by a drain current which remains substantially constant for changes in a drain voltages, thereby providing a constant current source.

28. The semiconductor device of claim 20, further including means for connecting a gate terminal associated with said first semiconductor region to a drain terminal associated with said second semiconductor region to provide Zener effects.

* * * * *